US009978887B2

(12) United States Patent
Altmejd et al.

(10) Patent No.: US 9,978,887 B2
(45) Date of Patent: May 22, 2018

(54) LIGHT DETECTOR USING AN ON-DIE INTERFERENCE FILTER

(71) Applicant: Silicon Laboratories Inc., Austin, TX (US)

(72) Inventors: Moshe Morrie Altmejd, Austin, TX (US); Kevin T. Kilbane, Austin, TX (US); Jefferson Lim Gokingco, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 121 days.

(21) Appl. No.: 14/525,807

(22) Filed: Oct. 28, 2014

(65) Prior Publication Data

US 2016/0118509 A1 Apr. 28, 2016

(51) Int. Cl.
*H01L 31/0216* (2014.01)
*H01L 31/0232* (2014.01)

(52) U.S. Cl.
CPC .. *H01L 31/02165* (2013.01); *H01L 31/02327* (2013.01)

(58) Field of Classification Search
CPC ......... H01L 31/02165; H01L 31/02327; H01L 31/0216; H01L 31/0232; G01J 1/0492; G01J 1/1626; G01J 1/4204
See application file for complete search history.

(56) References Cited

U.S. PATENT DOCUMENTS

| 4,253,764 | A | 3/1981 | Morrill | |
|---|---|---|---|---|
| 4,775,853 | A | 10/1988 | Perez Borruat | |
| 4,779,980 | A | 10/1988 | Hulstrom et al. | |
| 6,201,250 | B1 | 3/2001 | Morlock | |
| 6,426,503 | B1 | 7/2002 | Wuest | |
| 8,003,945 | B1 * | 8/2011 | Wong | G01J 5/0014 250/343 |
| 8,008,613 | B2 | 8/2011 | Tam | |
| 8,275,413 | B1 | 9/2012 | Fraden et al. | |
| 8,400,627 | B2 * | 3/2013 | Jak | G01J 1/02 356/218 |
| 8,415,626 | B1 * | 4/2013 | Wong | G01J 5/045 250/340 |
| 8,598,672 | B2 * | 12/2013 | Wang | H01L 27/14618 257/432 |
| 8,624,341 | B2 * | 1/2014 | Holenarsipur | H01L 27/14621 257/432 |
| 8,749,007 | B1 * | 6/2014 | Kerness | H01L 27/14618 257/432 |
| 8,779,540 | B2 * | 7/2014 | Kerness | H01L 27/14618 257/432 |
| 8,791,404 | B2 * | 7/2014 | Kerness | H01L 27/14618 250/226 |
| 8,803,068 | B2 * | 8/2014 | Kerness | H01L 27/1446 250/226 |
| 8,803,270 | B2 * | 8/2014 | Holenarsipur | H01L 27/14621 257/432 |
| 8,922,788 | B2 * | 12/2014 | Addison | G01B 11/14 356/614 |

(Continued)

*Primary Examiner* — John Lee
(74) *Attorney, Agent, or Firm* — Zagorin Cave LLP

(57) ABSTRACT

A light detector includes a semiconductor die that provides a photo sensor. An interference filter is formed on the semiconductor die and has a pass band corresponding to a wavelength of a light emitting diode to supply filtered light in the pass band to the photo sensor.

18 Claims, 3 Drawing Sheets

(56) References Cited

U.S. PATENT DOCUMENTS

| | | | |
|---|---|---|---|
| 9,224,884 B2 * | 12/2015 | Kerness | H01L 27/14618 |
| 9,224,890 B1 * | 12/2015 | Kerness | H01L 27/14618 |
| 2004/0235431 A1 | 11/2004 | Jung | |
| 2005/0236576 A1 | 10/2005 | Yagi | |
| 2006/0076501 A1 | 4/2006 | Yagi | |
| 2006/0285208 A1 * | 12/2006 | Huang | G02B 5/282 |
| | | | 359/559 |
| 2007/0187579 A1 | 8/2007 | Wunderer et al. | |
| 2007/0268533 A1 | 11/2007 | Kijima et al. | |
| 2008/0237453 A1 | 10/2008 | Chen | |
| 2009/0316286 A1 * | 12/2009 | Litvin | H04J 14/02 |
| | | | 359/887 |
| 2010/0032569 A1 | 2/2010 | Kita | |
| 2010/0051017 A1 | 3/2010 | Xie et al. | |
| 2010/0102230 A1 | 4/2010 | Chang | |
| 2010/0181485 A1 | 7/2010 | Legras | |
| 2010/0302532 A1 | 12/2010 | Chen | |
| 2011/0007306 A1 * | 1/2011 | Jak | G01J 1/02 |
| | | | 356/225 |
| 2011/0008525 A1 | 1/2011 | Dalakos et al. | |
| 2011/0046828 A1 | 2/2011 | Chander | |
| 2011/0064114 A1 | 3/2011 | Zettler et al. | |
| 2011/0248170 A1 | 10/2011 | Holcombe et al. | |
| 2012/0018637 A1 * | 1/2012 | Mitani | H03K 17/941 |
| | | | 250/339.02 |
| 2012/0027290 A1 | 2/2012 | Baheti | |
| 2012/0176504 A1 | 7/2012 | Lee | |
| 2012/0187280 A1 * | 7/2012 | Kerness | H01L 31/167 |
| | | | 250/214.1 |
| 2012/0187281 A1 * | 7/2012 | Kerness | H01L 27/14618 |
| | | | 250/214.1 |
| 2012/0187512 A1 * | 7/2012 | Wang | H01L 27/14618 |
| | | | 257/432 |
| 2012/0187513 A1 * | 7/2012 | Holenarsipur | H01L 27/14621 |
| | | | 257/432 |
| 2012/0187515 A1 * | 7/2012 | Kerness | H01L 27/14618 |
| | | | 257/432 |
| 2012/0205765 A1 | 8/2012 | Hynecek | |
| 2012/0212738 A1 * | 8/2012 | Bahatt | G01N 21/0332 |
| | | | 356/328 |
| 2012/0287417 A1 * | 11/2012 | Mimeault | G01C 3/08 |
| | | | 356/5.01 |
| 2013/0057699 A1 | 3/2013 | Ooki | |
| 2013/0085729 A1 | 4/2013 | Tsuruta et al. | |
| 2013/0179078 A1 | 7/2013 | Griffon | |
| 2013/0231536 A1 * | 9/2013 | Pascal | A61B 1/00186 |
| | | | 600/178 |
| 2013/0292706 A1 * | 11/2013 | Costello | H01L 31/167 |
| | | | 257/82 |
| 2013/0324819 A1 * | 12/2013 | Colvin, Jr. | G01N 21/6428 |
| | | | 600/342 |
| 2013/0325357 A1 | 12/2013 | Walerow | |
| 2014/0027876 A1 * | 1/2014 | Holenarsipur | H01L 27/14621 |
| | | | 257/432 |
| 2014/0092238 A1 | 4/2014 | Sandhu et al. | |
| 2014/0125990 A1 * | 5/2014 | Hinderling | G02B 5/284 |
| | | | 356/496 |
| 2014/0131576 A1 | 5/2014 | Park | |
| 2014/0155715 A1 * | 6/2014 | Chen | A61B 5/14551 |
| | | | 600/324 |
| 2014/0176944 A1 * | 6/2014 | Addison | G01B 11/14 |
| | | | 356/400 |
| 2014/0210028 A1 | 7/2014 | Chen | |
| 2014/0267170 A1 * | 9/2014 | Mckiel, Jr. | G09B 21/001 |
| | | | 345/175 |
| 2014/0267208 A1 | 9/2014 | Yajima | |
| 2014/0284748 A1 * | 9/2014 | Kerness | H01L 27/14618 |
| | | | 257/432 |
| 2014/0288400 A1 * | 9/2014 | Diab | A61B 5/14552 |
| | | | 600/324 |
| 2014/0349629 A1 | 11/2014 | Chan | |
| 2014/0374600 A1 * | 12/2014 | Gokingco | G01J 1/0295 |
| | | | 250/340 |
| 2016/0041029 A1 * | 2/2016 | T'Ng | G01J 1/0271 |
| | | | 250/239 |
| 2016/0118509 A1 * | 4/2016 | Altmejd | H01L 31/02327 |
| | | | 250/226 |
| 2016/0141322 A1 * | 5/2016 | Gokingco | H01L 27/14621 |
| | | | 250/226 |

\* cited by examiner

LIGHT DETECTOR USING AN ON-DIE INTERFERENCE FILTER

BACKGROUND

Field of the Invention

This invention relates to sensing light and more particularly the use of interference filters in sensing light.

Description of the Related Art

Sensing light is used in a wide variety of applications such as proximity detectors, heart rate monitors, and pulse oximetry (oxygen levels in blood). These light detectors often work in environments having strong levels of sunlight and artificial sources. Such light can interfere with operation of the photo sensor used in the proximity detector, heart rate monitors and pulse oximetry. Accordingly, it would be desirable to improve light sensing operations for a variety of applications.

SUMMARY OF EMBODIMENTS OF THE INVENTION

In an embodiment, an apparatus includes a semiconductor die including a photo sensor. An interference filter is formed on the semiconductor die and the interference filter has a pass band corresponding to a wavelength of a light emitting diode.

In another embodiment, a method includes receiving light at an interference filter formed on a semiconductor die surface. The interference filter filters the received light to allow light to pass in a pass band corresponding to a wavelength of a light emitting diode. The light is supplied to a photo sensor.

In another embodiment an apparatus includes a semiconductor die including a first and second photo sensor. A first interference filter formed on the semiconductor die has a pass band corresponding to a first wavelength of a first light emitting diode. A second interference filter formed on the semiconductor die has a second pass band corresponding to a second wavelength of a second light emitting diode.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
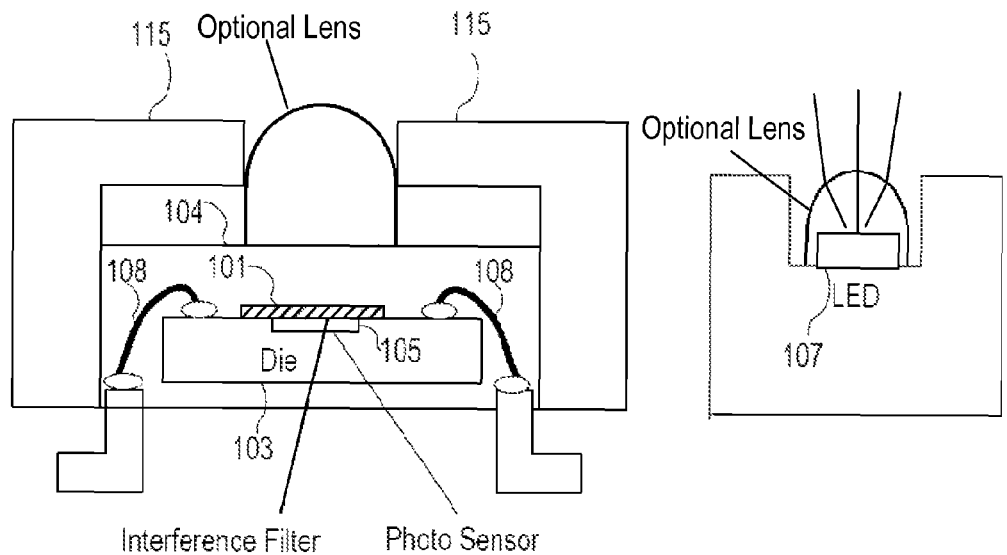
FIG. 1 illustrates an apparatus according to an embodiment including an interference filter and a photo sensor.

FIG. 1 illustrates a high level block diagram for an embodiment that may be used in a proximity detector, heart rate monitor, or a pulse oximetry detector. The embodiment illustrated in FIG. 1 utilizes a narrow-band interference filter 101 placed on a silicon die 103. The interference filter functions to pass light of a particular wavelength while rejecting light of other wavelengths. The light that passes through the interference filter is sensed by photo sensor 105. The center frequency wavelength of the interference filter's pass band is chosen based on the intended LED wavelength used externally. The interference filter significantly reduces the amount of light energy having frequencies that did not originate in the LED and would otherwise be seen as noise by the photo sensor. That allows for better sensor performance under strong levels of interfering light such as sunlight. One tradeoff is that once the interference filter has been installed on the die, the device can only be used with a specific LED wavelength. However, that is not necessarily an issue since the LED wavelength choice is generally picked based on the application usage. Bond wires 108 couple the silicon die with the substrate or metal lead frame that form part of the package. Clear epoxy encapsulant 104 seals the die and helps form the package.

The interference filter 101 may be formed on the die 103 by standard lithographic techniques such as etching or liftoff to form a multilayer, e.g., 50 layers providing reflection at interfaces of the various layers to provide appropriate constructive and destructive interference to achieve an interference filter having a pass band of interest.

There are three main economic advantages to the integration of the interference filter onto the silicon. The first is that the same thin film processing steps used in making the silicon may be used in making the filter. Secondly, the total surface area that needs coating can be reduced, in that only the surface area of the silicon die/wafer needs to be formed as opposed to the larger surface area of a glass filter placed above the sensor. Thirdly, there is no need to handle and mount an extra component (the glass filter) in making the product.

In operation LED 107, which could be one of several LEDs, illuminates an object (not shown in FIG. 1). Depending on the application the object either reflects light at its surface (proximity measurements), or returns the light after it has passed through some tissue such as in heart rate monitoring and pulse oximetry. The object returns light towards the interference filter 101, which passes the returned light to the photo sensor 105.

Figure 2:
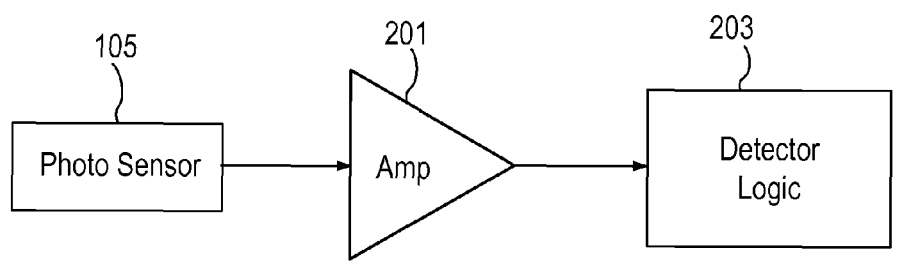
FIG. 2 illustrates a high level block diagram of additional components that may be utilized in an embodiment of a proximity detector, a heart rate monitor, or a pulse oximetry detector.

FIG. 2 illustrates a high level block diagram of other portions of the detector of FIG. 1. As shown in FIG. 2, the photo sensor 105 supplies a voltage or current corresponding to the sensed light to an amplifier 201, which in turns supplies the amplified signal corresponding to the sensed light to detector logic 203. That logic may include a microcontroller, or other logic to implement the detection and control functions described herein.

For example, in an embodiment the proximity, heart rate, or pulse oximetry detector senses light with the LED 107 off so as to obtain a background light level. The microcontroller controls the LED to turn on and light is sensed after turning on the LED. The two readings may be compared by the detection logic 203 to determine whether an object is present. If an object is present, the two readings (with LED off and on) will be different due to reflection of LED light off of the proximate object. If there is no object to reflect light, any difference between the two readings will be sufficiently small as to indicate no object. In the case of heart rate, or pulse oximetry, the measured returned light value is stored as a sample and a large number of samples are processed to derive the biological data using well known techniques.

Figure 3:
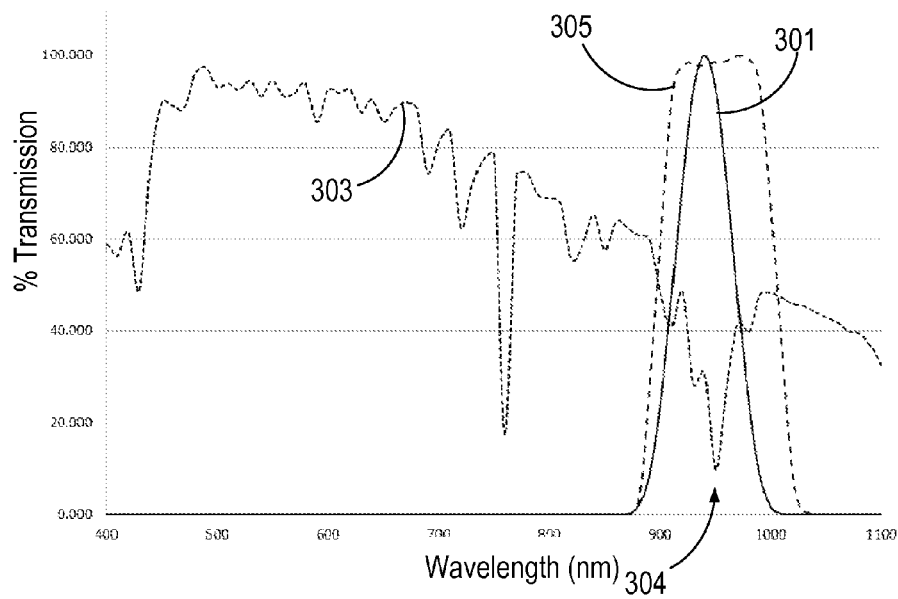
FIG. 3 illustrates the sunlight spectrum and operation of a 940 nm bandpass interference filter.

Referring to FIG. 3, in an embodiment, the LED 107 emits light 301 having a center frequency of near infrared (IR), e.g., 940 nanometers. The curve 301 shows typical LED signal energy density normalized to 100. Curve 303 shows the sunlight spectrum normalized to 100, and can be seen to be significantly reduced at 304. Thus, using a sensor at that wavelength reduces possible interference from the sunlight spectrum. FIG. 3 also shows the 0 degree flat filter response 305 of the interference filter associated with such an LED. In embodiments, the pass band of the interference filter may designed to be larger than the sum of the LED energy distribution, the variability of the LED spectrum due to manufacturing, and the variability of the interference filter due to manufacturing. In the example of the frequency response 305, note that the 0 degree response is off center so that the off angle response is improved. Off angle filter response is discussed further below in relation to FIG. 4. Most of the interference at frequencies other than the pass band is removed by the interference filter rejecting light having wavelengths other than the pass band of interest. While other frequencies may be used, choosing to operate the proximity sensor at 940 nm provides good immunity to sunlight.

But depending on the application, other LED wavelengths may be chosen and the interference filter is designed to correspond to the chosen LED wavelength. For example, in the usage case where the detector is used in a consumer, non-medical heart rate monitor application, an LED wavelength may be chosen for either green light, e.g., at approximately 535 nm or for yellow light, e.g., at approximately 590 nm, so as to get a maximum blood pulsation signal. For these cases, the detector may have, e.g., a 535 nm or 590 nm interference filter manufactured on-die for that usage case. Such a proximity detector would be used with LED(s) that have matching transmission wavelengths.

Placing the interference filter on-die provides advantages over using after-market interference filters. Since interference filter response has angular dependencies, having the filter closer to the sensor allows system-level angular control of the light entering the system. In contrast, interference filters located off of the die need to be as large as the end product aperture, which has cost implications as well as inferior angular performance.

Figure 4:
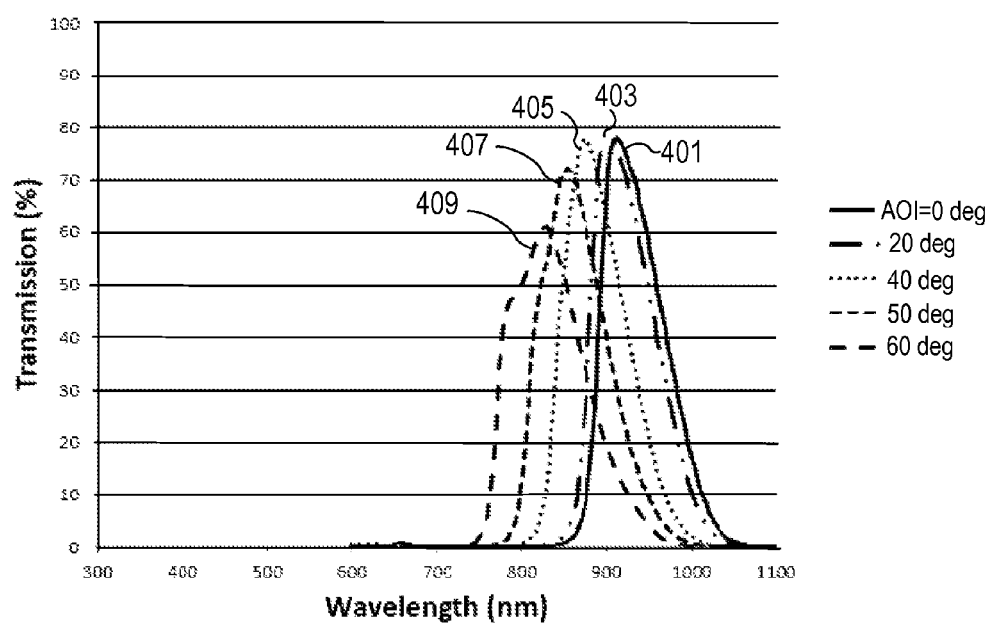
FIG. 4 illustrates the effect of angle of incidence on operation of an interference filter.
Figure 5:
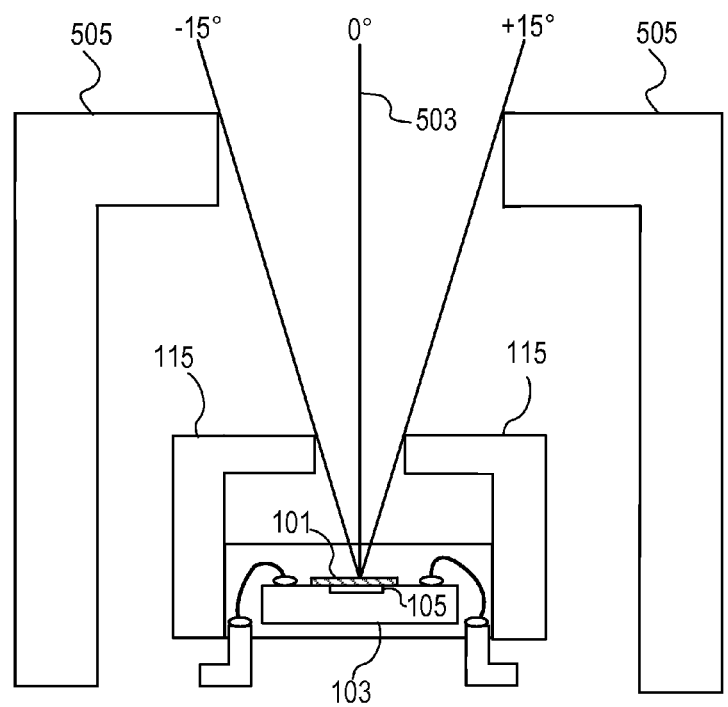
FIG. 5 illustrates a housing having an aperture to limit the angle of light incident on the interference filter.

FIG. 4 illustrates how angular performance affects operation of the interference filter. As the angle of incidence (AOI) increases, the effectiveness of the interference filter lessens. For example, for an angle of incidence of 0, 20 degrees, or 40 degrees from vertical as shown by curves 401, 403, and 405 respectively, the transmission percentage is approximately 78 percent for frequencies between 880 and 940 nm. However, as shown by curves 407 and 409, at an angle of incidence of 50 degrees the transmission percentage is approximately 72 percent at approximately 850 nm and for an angle of incidence of 60 degrees, the transmission percentage of 825 nm light is approximately 60 percent. Because the wavelength increases with the angle of incidence, the interference filter passes a higher percentage of light of other wavelengths and the wavelengths of the pass band are passed less efficiently. That contributes to a noisy signal received by the photo sensor. Thus, the interference filter tends to work best at around 0 degrees angle of incidence (AOI). At relatively large off angles, e.g., greater than 30 degrees, the interference filters tend to let in less of the desired energy and more of the undesired energy. Off angle light can either be ignored or masked through appropriate baffling techniques as shown in FIG. 5 so that only light at an acceptable angle range reaches the filter.

Thus, referring to FIG. 1, in embodiments, a housing 115 is provided that controls the angle of the light incident on the interference filter 101. Referring to FIG. 5, the housing 115 may be used to limit the angle of incident light to ±15 degrees from vertical (line 503). Of course, depending on the particular application, housings with apertures providing other angles. e.g., ±30 degrees may be used. A housing structure 505 may be provided in addition to or in place of the housing structure 115. Thus, the optical masking structure may be larger (505) or smaller (115).

As discussed above, various applications may employ diodes, interference filters, and photo sensors. For example, as discussed above, a single wavelength at 940 nm may be used for proximity/distance measurements or for measuring heart rate. Of course, a single wavelength at any practical wavelength may be used for proximity/distance measurements. Near infrared may be preferred because it is invisible to humans and 940 nm may also be preferred for use with an interference filter because of the roughly 60% reduction in sunlight in that frequency area compared to adjacent wavelengths. In other applications a single green wavelength, e.g., at 535 nm, may be used for detecting heart rate at some skin locations. In still other embodiments, dual green and yellow wavelengths may be used for determining heart rate at some skin locations and some skin coloration. In still other embodiments, dual wavelengths at approximately 940 nm (near IR) and approximately 660 (deep red) may be used for pulse oximetry and heart rate measurements.

Figure 6:
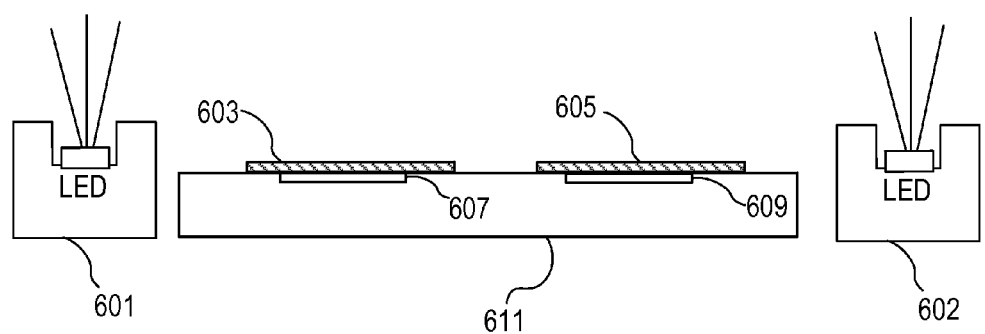
FIG. 6 illustrates an embodiment with two interference filters on a single die.

Because the interference filters are integrated on the die, applications using dual wavelengths can have interference filters designed for both wavelengths formed on the same die. For example, FIG. 6 illustrates a dual LED and sensor pair where the excitation is 940 nm and 660 nm using LEDs 601 and 602, respectively, with filters 603 and 605 matched to 940 nm and 660 nm, respectively. Photo sensors 607 and 609 sense the light passed by their respective interference filters. Both interference filters 603 and 605 and photo sensors 607 and 609 are integrated on the same die 611 thus providing significant savings in parts and space. The ratio of the signals measured may be used using standard techniques to evaluate the oxygenation of blood. While two interference filters are shown on die 601, some embodiments may take advantage of having the interference filters integrated on the die and utilize more than two interference filters and LED pairs.

Thus, various aspects of the use of on-die interference filters have been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   a semiconductor die including a photo sensor; and
   an interference filter formed on the semiconductor die having a pass band corresponding to light emitted by a light emitting diode,
   wherein a zero degree angle of incidence response of the interference filter at the pass band is off center with respect to a center frequency of the light emitted by the light emitting diode to thereby improve off angle response of the interference filter, and wherein the interference filter passes more than 80 percent of light at the center frequency.

2. The apparatus, as recited in claim 1, further comprising: a second interference filter formed on the semiconductor die having a second pass band corresponding to second light emitted by a second light emitting diode.

3. The apparatus, as recited in claim 1, further comprising the light emitting diode.

4. The apparatus, as recited in claim 1, wherein the pass band passes light having a wavelength of 940 nanometers.

5. The apparatus, as recited in claim 4, wherein the pass band has a bandwidth of approximately 80 nanometers.

6. The apparatus, as recited in claim 1, wherein the pass band passes one of green or yellow light.

7. The apparatus, as recited in claim 1 wherein the apparatus is a proximity detector, a heart rate monitor, or a pulse oximetry detector.

8. The apparatus, as recited in claim 1 further comprising a housing having an aperture to control an angle of incident light on the interference filter.

9. The apparatus, as recited in claim 8 wherein the aperture is configured in the housing to provide that light passing through the aperture is incident on the interference filter with an angle of incidence of between about minus fifteen degrees to about plus fifteen degrees and light at other angles is blocked by the aperture from being incident on the interference filter.

10. The apparatus, as recited in claim 8 wherein the aperture is configured in the housing to provide that light passing through the aperture is incident on the interference filter with an angle of incidence of between about plus or minus thirty degrees and light at other angles is blocked by the aperture from being incident on the interference filter.

11. A method comprising:
receiving light at an interference filter formed on a semiconductor die;
filtering the light in the interference filter to allow light to pass in a pass band corresponding to light emitted by a light emitting diode, wherein a zero degree angle of incidence response of the interference filter at the pass band is off center with respect to a center frequency of the light emitted by the light emitting diode, and wherein the interference filter passes more than 80 percent of light at the center frequency;
supplying filtered light from the interference filter; and
supplying the filtered light to a photo sensor.

12. The method as recited in claim 11, further comprising:
receiving second light at a second interference filter formed on the semiconductor die;
filtering the second light to allow light to pass in a second pass band corresponding to second light emitted by a second light emitting diode and supplying second filtered light; and
supplying the second filtered light to a second photo sensor.

13. The method as recited in claim 11, wherein the pass band includes wavelengths of one of near infrared, green, or yellow light.

14. The method as recited in claim 11 wherein the light received at the interference filter includes light from the light emitting diode reflected by an object.

15. The method as recited in claim 11 further comprising receiving the light at the interference filter through an aperture in a housing to control an angle of light incident on the interference filter.

16. The method, as recited in claim 15 further comprising:
receiving the light passing through the aperture that is incident on the interference filter within a predetermined number of degrees from vertical, where vertical is perpendicular to the interference filter; and
blocking light having an angle of more than the predetermined number of degrees from vertical from being incident on the interference filter using the housing.

17. The method, as recited in claim 11 further comprising making a first measurement with the light emitting diode not emitting light to determine an ambient level of light in the pass band and making a second measurement with the light emitting diode emitting light to determine presence of an object based on reflected light of the light emitting diode.

18. The apparatus as recited in claim 1 further comprising:
a first housing structure and a second housing structure, the first and second housing structures configured to limit an angle of light incident on the interference filter.

* * * * *